US008027490B2

(12) United States Patent
Lin et al.

(10) Patent No.: US 8,027,490 B2

(45) Date of Patent: Sep. 27, 2011

(54) AUDIO CONTROL METHOD AND AUDIO PROCESSING SYSTEM

(75) Inventors: Wu-Hung Lin, Hsinchu (TW); Ta-Ching Lu, Hsinchu (TW)

(73) Assignee: Coretronic Corporation, Science-Based Industrial Park, Hsinchu (TW)

(*) Notice: Subject to any disclaimer, the term of this patent is extended or adjusted under 35 U.S.C. 154(b) by 1117 days.

(21) Appl. No.: 11/773,443

(22) Filed: Jul. 5, 2007

(65) Prior Publication Data

US 2008/0063220 A1 Mar. 13, 2008

(30) Foreign Application Priority Data

Sep. 13, 2006 (TW) ............................... 95133802 A

(51) Int. Cl.
*H03F 99/00* (2009.01)

(52) U.S. Cl. .......... 381/120; 381/55; 381/104; 330/129; 330/136

(58) Field of Classification Search .................. 381/120, 381/55; 330/129, 136
See application file for complete search history.

(56) References Cited

U.S. PATENT DOCUMENTS

| | | | | |
|---|---|---|---|---|
| 5,983,183 | A | 11/1999 | Tabet | |
| 6,678,011 | B2 | 1/2004 | Yanagi | |
| 6,763,228 | B2 | 7/2004 | Prentice | |
| 7,164,774 | B2 * | 1/2007 | Inoue | 381/109 |
| 7,242,784 | B2 * | 7/2007 | Cranfill et al. | 381/107 |
| 7,505,824 | B2 * | 3/2009 | Ebi et al. | 700/94 |
| 7,774,201 | B2 * | 8/2010 | Yamada | 704/225 |
| 2002/0086651 | A1 | 7/2002 | Prentice | |
| 2003/0059063 | A1 | 3/2003 | Inoue | |
| 2004/0162104 | A1 | 8/2004 | Ozluturk | |
| 2006/0015199 | A1 | 1/2006 | Ebi | |
| 2007/0002190 | A1 * | 1/2007 | Maehata et al. | 348/837 |

FOREIGN PATENT DOCUMENTS

| | | |
|---|---|---|
| JP | 2005-167380 | 6/2005 |
| TW | 205941 | 5/1993 |

* cited by examiner

*Primary Examiner* — Vivian Chin
*Assistant Examiner* — David Ton
(74) *Attorney, Agent, or Firm* — Winston Hsu; Scott Margo

(57) ABSTRACT

An audio control method and audio processing system utilize an ADC to sample an analog audio input signal and convert it to a digital audio signal. A control module determines input signal level from the digital audio signal. Based on different input signal levels, output gain range of the amplifier can be set. In this way, the present invention can prevent speakers being burned out or volume being too low.

8 Claims, 4 Drawing Sheets

AUDIO CONTROL METHOD AND AUDIO PROCESSING SYSTEM

BACKGROUND OF THE INVENTION

1. Field of the Invention

The present invention relates to audio control methods and audio processing systems, and more particularly, to an audio processing system with automatic gain adjustment based on an analog audio input signal.

2. Description of the Prior Art

Please refer to FIG. 1. In a conventional audio processing system 10, speakers 18 produce sounds when an analog audio source signal from an analog audio input source 12 is amplified by an amplifier 14 and the resulting analog audio signal drives the speakers 18. The amplifier 14, according to a control signal from a control device 16, adjusts the gain of the amplifier 14, so as to control the level of the audio signal, such that the speakers 18 can output the sound at different volumes.

However, in the conventional audio processing system 10, the gain range of the amplifier 14 is fixed. Typically, the gain of the amplifier 14 controlled by the control device 16 is set to a middle value of the range in advance. Then, based on audio signals with different signal amplitudes, a user can adjust the volume to an acceptable level via the control device 16. However, because the gain range of the amplifier 14 is fixed, a great deal of inconvenience can be caused if the audio signal is at an extreme signal amplitude. For example, when the audio input signal amplitude is extremely high, and the gain of the amplifier 14 is also set at the upper end of the gain range, the speakers 18 can be overloaded and burn out within just a short period of time. On the other hand, if the audio input signal amplitude is extremely low, even if the gain of the amplifier 14 is set at the highest value of the gain range, the volume at the speakers 18 may still be too low, and will be unable to satisfy the listener. In addition, when the analog audio input source 12 is not inputting an audio source signal, the conventional audio processing system 10 has no way of automatically entering a mute state, but must be manually adjusted by the user.

SUMMARY OF THE INVENTION

The objective of the present invention is to provide an audio control method and an audio processing system to solve the above problems.

According to the present invention, the audio control method comprises setting a predetermined upper gain and a predetermined lower gain of a standard gain range of an amplifier, setting an audio output criterion, and setting an output gain range of the amplifier according to an input signal level of a digital audio signal and the audio output criterion.

According to the present invention, the audio processing system comprises an analog input audio source for outputting an analog audio input signal, an amplifier coupled to the analog input audio source and the control module for controlling a level of the analog audio input signal according to an output gain range, a memory for setting and storing a standard gain range of the amplifier, a control module coupled to the memory for setting an audio output criterion and an input signal level of a digital audio signal, and setting the output gain range of the amplifier according to the input signal level and the audio output criterion, and a speaker coupled to the amplifier for outputting a sound.

Other objectives, features and advantages of the present invention will be further understood from the further technology features disclosed by the embodiments of the present invention wherein there are shown and described preferred embodiments of this invention, simply by way of illustration of modes best suited to carry out the invention.

DETAILED DESCRIPTION

Figure 1:
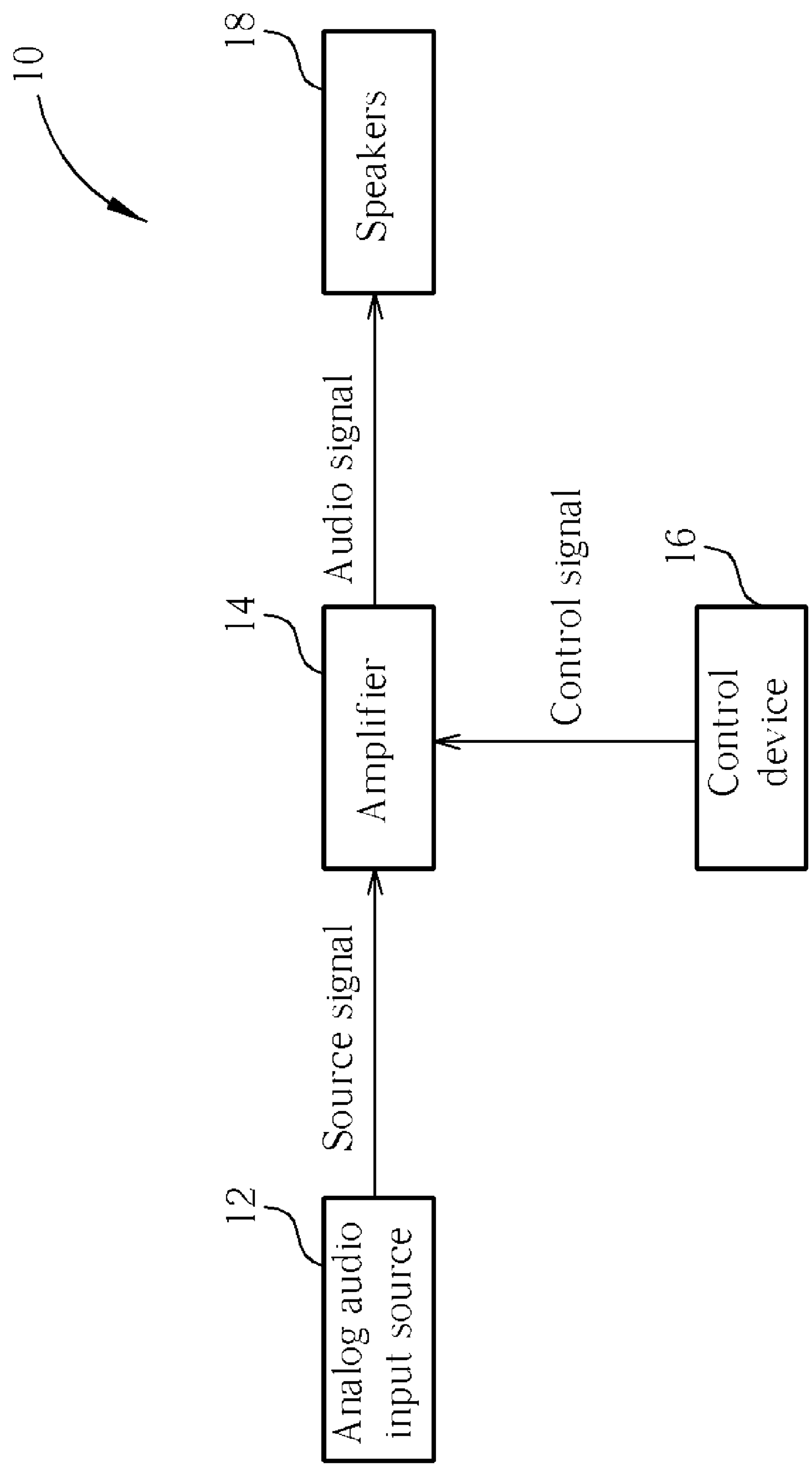
FIG. 1 is a diagram of a conventional audio processing system.
Figure 2:
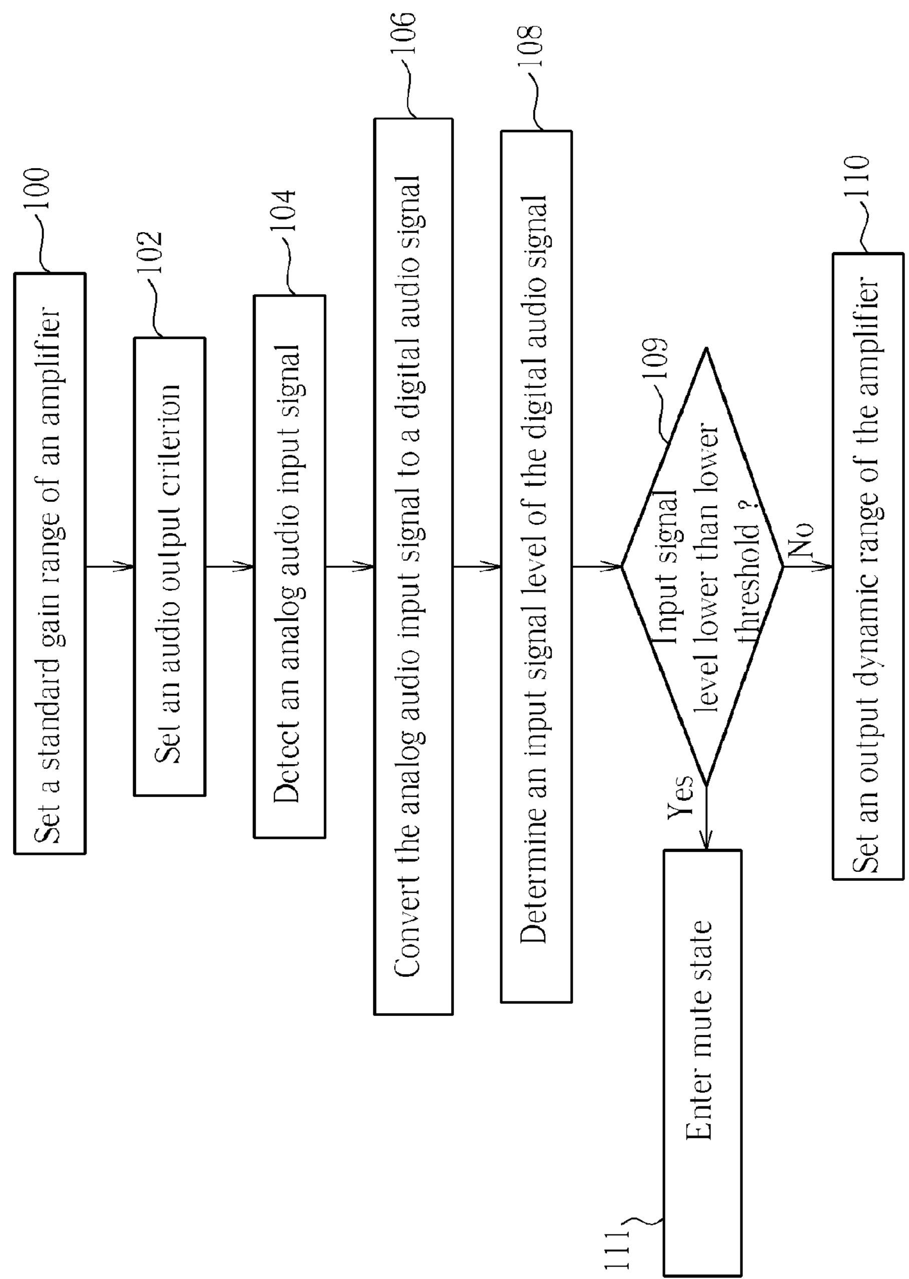
FIG. 2 is a flowchart of an audio control method according to a preferred embodiment of the present invention.

Please refer to FIG. 2, which is a flowchart of an audio control method according to a preferred embodiment of the present invention. The method is used in an audio control system, and comprises:

Step 100: setting a standard gain range of an amplifier;

Step 102: setting an audio output criterion;

Step 104: detecting an analog audio input signal from an analog input audio source;

Step 106: converting the analog audio input signal to a digital audio signal;

Step 108: determining an input signal level of the digital audio signal; and Step 110: setting an output gain range of the amplifier.

In Step 100, the standard gain range is a predetermined range set in the amplifier of the audio processing system from a minimum gain value to a maximum gain value. In Step 102, the audio output criterion is set in the audio processing system. The audio output criterion has an upper threshold and a lower threshold. In Step 104, the analog audio input signal is detected from an analog audio input source. In Step 106, an analog-to-digital converter (ADC) is used to convert the analog audio input signal to the digital audio signal which is capable of being analyzed. Each digital audio signal has an associated power value that represents the amplitude of the audio input signal. In Step 108, within a predetermined period of time, a plurality of the digital audio signals is obtained, and an average power of the plurality of the digital audio signals is calculated. The average power is an input signal level used for comparison with the audio output criterion. In Step 110, the output gain range of the amplifier of the audio processing system is set based on a result of comparing the input signal level and the audio output criterion. The gain range is a range from a minimum gain value to a maximum gain value, and the gain range can guarantee that the output of the speakers stays in a dynamic range thereof. The dynamic range of the speakers is a volume range through which the speakers are able to function normally, and is a volume range from a lowest output volume (i.e. mute) to a highest output volume of the speakers. When the input signal level is lower than the lower threshold within the predetermined period of time, the power of the audio signal received by the audio processing system is generally low, which normally results in the output power of the speakers being too low. Thus, the audio control method according to the present invention keeps the minimum gain value of the gain range of the amplifier at the predetermined minimum gain value, and set the maximum gain value of the gain range of the amplifier higher than the maximum gain value of the standard gain range, such that the amplifier can control the speakers to have a higher output volume. When the input signal level is higher than the upper threshold within the predetermined time period, the power of the audio signal received by the audio processing system is generally high, which normally results in the output power of the speaker being too high, so that the speakers may be damaged. Thus, the audio control method according to the present invention will keep the minimum gain value of the gain range of the amplifier at the predetermined minimum value, and set the maximum gain value of the gain range lower than the maximum gain value of the standard gain range, so that the amplifier can control the speakers to have a lower output volume. When the input signal level is between the upper threshold and the lower threshold during the predetermined period of time, the audio control method according to the present invention sets the output gain range to the standard.

In addition, after determining the input signal level from the digital audio signal (Step 108) and before setting the output gain range (Step 110), the audio control method according to the present invention further comprises a step of determining whether the input signal level is lower than a threshold value (Step 109). When the input signal level is lower than the threshold (usually at a background noise volume) during the predetermined period of time, the maximum gain value and the minimum gain value of the output gain range of the amplifier are both set to 0×, i.e. the gain range is set to the minimum volume output level. In other words, the audio processing system enters a mute state (Step 111). However, when the input signal level is higher than the upper threshold during the predetermined period of time, the output gain range is adjusted as described above.

Figure 3:
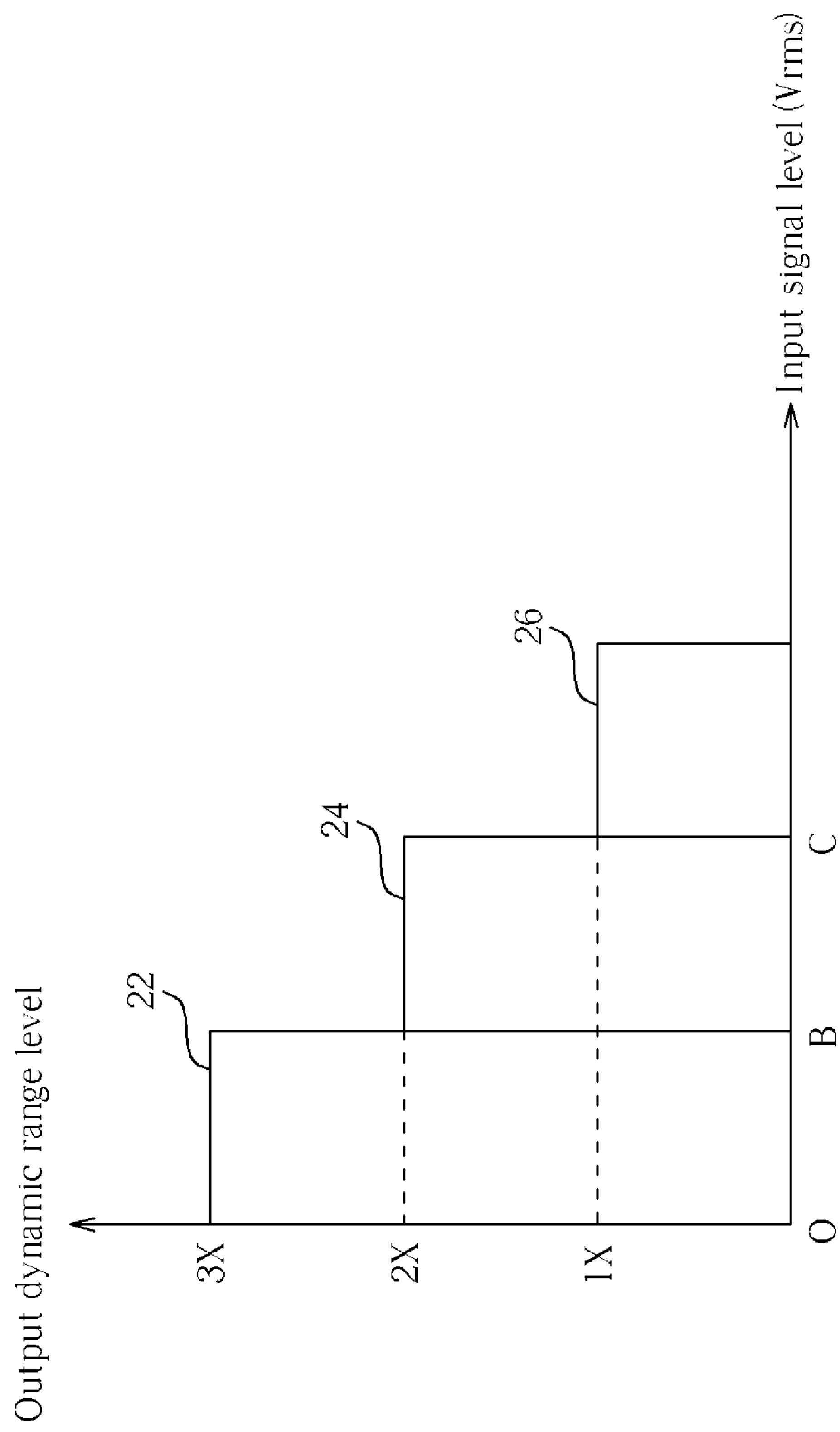
FIG. 3 is a diagram of the audio control method of FIG. 2.

Please refer to FIG. 3, which is a diagram of the audio control method of FIG. 2. As shown, the upper threshold of the audio output criterion is set to C Vrms and the lower threshold is set to B Vrms. As an example, a typical Dolby output has a standard audio range between 1-2 Vrms. At the same time, the standard gain range of the amplifier in the audio processing system is 0-2×, where 0× represents mute, that is, the minimum gain value is 0×, and the maximum gain value is 2×. It is assumed that the audio control method according to the present invention has not started, when the gain value of the amplifier is set to 2× (the user can control the amplifier to produce gain between 0× and 2×, and the output gain range is the standard gain range: 0-2×), and when the input signal level is detected as C Vrms during the predetermined period of time, the maximum power output by the amplifier to the speakers is W. The maximum power value W is within an acceptable range for the speakers. Thus, when the user adjusts the gain of the amplifier during the duration within this input signal level, the highest maximum power that can be produces is W, which is shown by a range 24 in FIG. 3.

When the input signal level is greater than C Vrms during the predetermined period of time, if the audio control method according to the present invention has not started, i.e. the output gain range is still the standard gain range: 0-2×, then the maximum power output by the amplifier to the speakers will exceed W, and the speakers are likely to burn out. However, as described in Step 110, the output gain range will be reset to 0-1× (where 1× is lower than 2×), as shown as a range 26 in FIG. 3. Thus, the maximum output power can still be limited to within W, so as to avoid burning out the speakers.

When the input signal level detected and obtained during the predetermined period of time is lower than B Vrms, if the audio control method according to the present invention has not been started, i.e. the output gain range is still the standard gain range: 0-2×, then maximum power output by the amplifier to the speakers will be lower than W, which results in the volume being too low. However, in Step 110, the output gain range is reset to 0-3× (where 3× is greater than 2×), as shown by a range 22 in FIG. 3. Thus, the maximum output power can be increased to W, such that the speakers will output an appropriate volume.

The above description is only for one embodiment of the present invention. In practical operation, the audio output criterion can be defined even more finely. For example, beyond setting the upper threshold and the lower threshold, third criterion and fourth criterion, etc. could be set, so as to make the adjustment in Step 110 to the input signal level all the more intelligent and adaptive.

Figure 4:
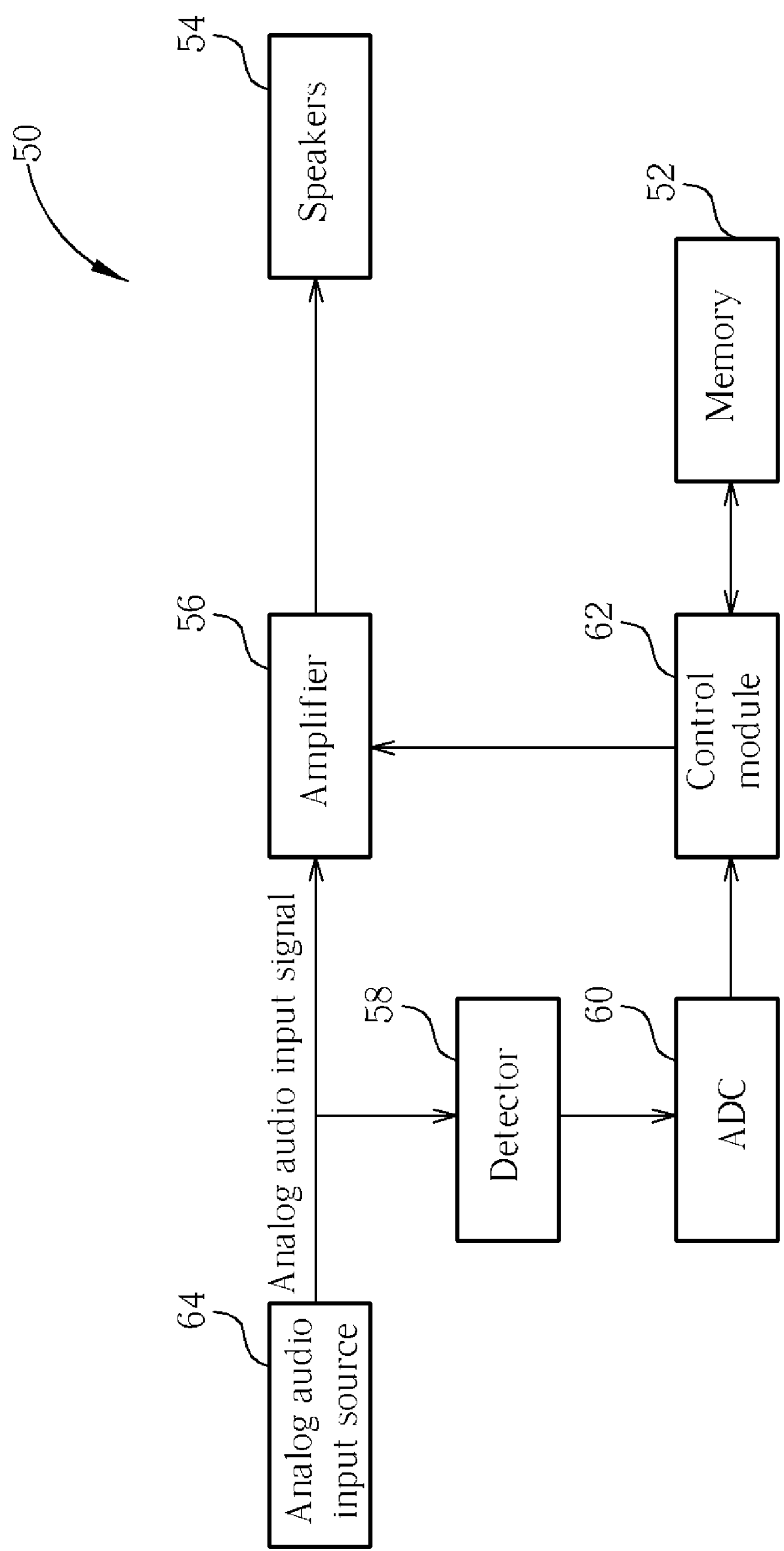
FIG. 4 is a diagram of an audio processing system according to the present invention.

In order to realize the audio control method according to the present invention as described above, software, firmware, or hardware components can be used to establish an audio processing system 50. Please refer to FIG. 4, which is a diagram of the audio processing system 50 according to the present invention. The audio processing system 50 comprises an analog audio input source 64, speakers 54, an amplifier 56, a detector 58, an ADC 60, a control module 62, and a memory 52. The amplifier 56 is coupled between the analog audio input source 64 and the speakers 54. The detector 58 is coupled to an output of the analog audio input source 64 for detecting an analog audio input signal from the analog audio input source 64. The ADC 60 is coupled between the detector 58 and the control module 62 for converting the analog audio input signal from the analog audio input source 64 detected by the detector module 58 to a digital audio signal. The control module 62 is coupled to the memory 52, the amplifier 56, and the ADC 60. The control module 62 determines the input signal level of the digital audio signal in accordance with the digital audio signal converted by the ADC 60. The control module 62 can also be used to set the audio output criterion and the standard gain range, and then store the audio output criterion and the standard gain range in the memory 52. Further, the control module 62 can be a processor for comparing the input signal level and the audio output criterion, and using the result of the comparison to set the output gain range of the amplifier 56. The memory 52 is used for storing the standard gain range and the audio output criterion. After the output gain range of the amplifier 56 is set, the user can control the volume in the speakers 54 via the control module 62 to adjust the gain of the amplifier 56 within the output gain range. In this way, the analog audio input signal from the analog audio input source 64 can be amplified appropriately by the amplifier 56, and the audio signal can be output to the speakers 54 for the speakers 54 to play the corresponding sound.

The audio control method and the audio processing system according to the present invention utilizes the ADC to sample the analog audio input signal and convert it to a digital audio signal, after which the control module 62 can determine the input signal level from the digital audio signal. Based on different input signal levels, the output gain range of the amplifier can be set. In this way, the present invention can prevent the problems that the speakers is burned out or the magnitude of the volume is too small, which occurs easily when different amplitudes of the audio source signals (i.e. analog audio input source) are input into a conventional audio control method. According to the present invention, the gain range of the amplifier can be adjusted to effectively control the speakers to output sounds within the dynamic range of the speakers. Also, through the comparison of the input signal level and the threshold, the audio processing system can automatically enter a mute state when there is no audio source signal input into the audio processing system.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of controlling audio for an audio processing system having an amplifier, the method comprising steps of:

setting a predetermined upper gain and a predetermined lower gain of a standard gain range of an amplifier;

detecting an analog audio input signal from an analog input audio source via a detector;

setting an audio output criterion; and setting an output gain range of the amplifier according to an input signal level of a digital audio signal and the audio output criterion.

2. The method of claim 1, wherein the step of setting the output gain range of the amplifier further comprises a step of setting an upper gain and a lower gain of the output gain range to zero to enter a mute state when the audio input signal level is lower than a threshold.

3. The method of claim 1, wherein the step of setting the audio output criterion is accomplished through setting a standard upper threshold and a standard lower threshold.

4. The method of claim 3, wherein the step of setting the output gain range of the amplifier comprises steps of:

setting a maximum gain of the output gain range to a value higher than the predetermined upper gain of the standard gain range and setting a minimum gain of the output gain range equal to the predetermined lower gain when the input signal level is lower than the standard lower threshold;

setting the maximum gain of the output gain range to a value lower than the predetermined upper gain of the standard gain range and setting the minimum gain of the output gain range equal to the predetermined lower gain when the input signal level is higher than the standard upper threshold; and setting the output gain range equal to the standard gain range when the input signal level is higher than the standard lower threshold and lower than the standard upper threshold.

5. The method of claim 1 further comprising steps of:

utilizing an analog-to-digital converter (ADC) to convert the analog audio input signal to a digital audio signal; and determining the input signal level of the digital audio signal according to an average power of the digital audio signal within a predetermined period of time.

6. An audio processing system comprising:

an analog input audio source for outputting an analog audio input signal;

a detector coupled to an output of the analog input audio source for detecting the analog audio input signal;

a memory for storing a standard gain range of an amplifier;

a control module coupled to the memory for setting an audio output criterion and an input signal level of a digital audio signal, and setting the output gain range of the amplifier according to the input signal level and the audio output criterion; and the amplifier coupled to the analog input audio source and the control module for controlling a level of the analog audio input signal according to the output gain range;

a speaker coupled to the amplifier for outputting a sound.

7. The audio processing system of claim 6 further comprising an analog-to-digital converter (ADC) coupled between the detector and the control module for converting the analog audio input signal to a digital audio signal.

8. The audio processing system of claim 7, wherein the control module is further utilized for determining the input signal level according to an average power of the digital audio signal within a predetermined period of time.

* * * * *